United States Patent [19]

Baliga et al.

[11] Patent Number: 4,890,143
[45] Date of Patent: Dec. 26, 1989

[54] PROTECTIVE CLAMP FOR MOS GATED DEVICES

[75] Inventors: Bantval J. Baliga; Charles S. Korman, both of Schenectady, N.Y.

[73] Assignee: General Electric Company, Schenectady, N.Y.

[21] Appl. No.: 225,320

[22] Filed: Jul. 28, 1988

[51] Int. Cl.⁴ .............................................. H01L 29/78
[52] U.S. Cl. ................................ 357/23.4; 357/23.13; 357/23.1
[58] Field of Search ..................... 357/23.4, 23.13, 23.1

[56] References Cited

U.S. PATENT DOCUMENTS

| | | | |
|---|---|---|---|
| 3,555,374 | 1/1971 | Usuda | 317/235 |
| 3,667,009 | 5/1972 | Rugg | 317/235 |
| 3,673,428 | 6/1972 | Athanas | 307/202 |
| 3,712,995 | 1/1973 | Steudel | 307/304 |
| 3,748,547 | 6/1973 | Sugimoto | 317/235 |
| 3,754,171 | 8/1973 | Anzai et al. | 317/235 |
| 3,764,864 | 10/1973 | Okumura et al. | 317/235 |
| 3,806,773 | 4/1974 | Watanabe | 317/235 |
| 4,110,775 | 8/1978 | Festa | 357/15 |
| 4,492,974 | 1/1985 | Yoshida et al. | 357/23 |
| 4,580,063 | 4/1986 | Torelli et al. | 307/200 |
| 4,617,482 | 10/1986 | Matsuda | 307/579 |
| 4,656,491 | 4/1987 | Igaraski | 357/23.13 |

FOREIGN PATENT DOCUMENTS 58-125873  7/1983  Japan .................. 357/23.4

Primary Examiner—Andrew J. James
Assistant Examiner—David Soltz
Attorney, Agent, or Firm—Marvin Snyder; James C. Davis, Jr.

[57] ABSTRACT

A self-protected MOS gated device includes a PN junction disposed in an electrical path between the source electrode and the gate contact of the device and integrally formed with a DMOS cell of the device to protect the DMOS cell from surge voltages. The PN junction has conductivity characteristics selected to provide junction breakdown at a predetermined voltage level and at a predetermined location along the junction.

16 Claims, 6 Drawing Sheets

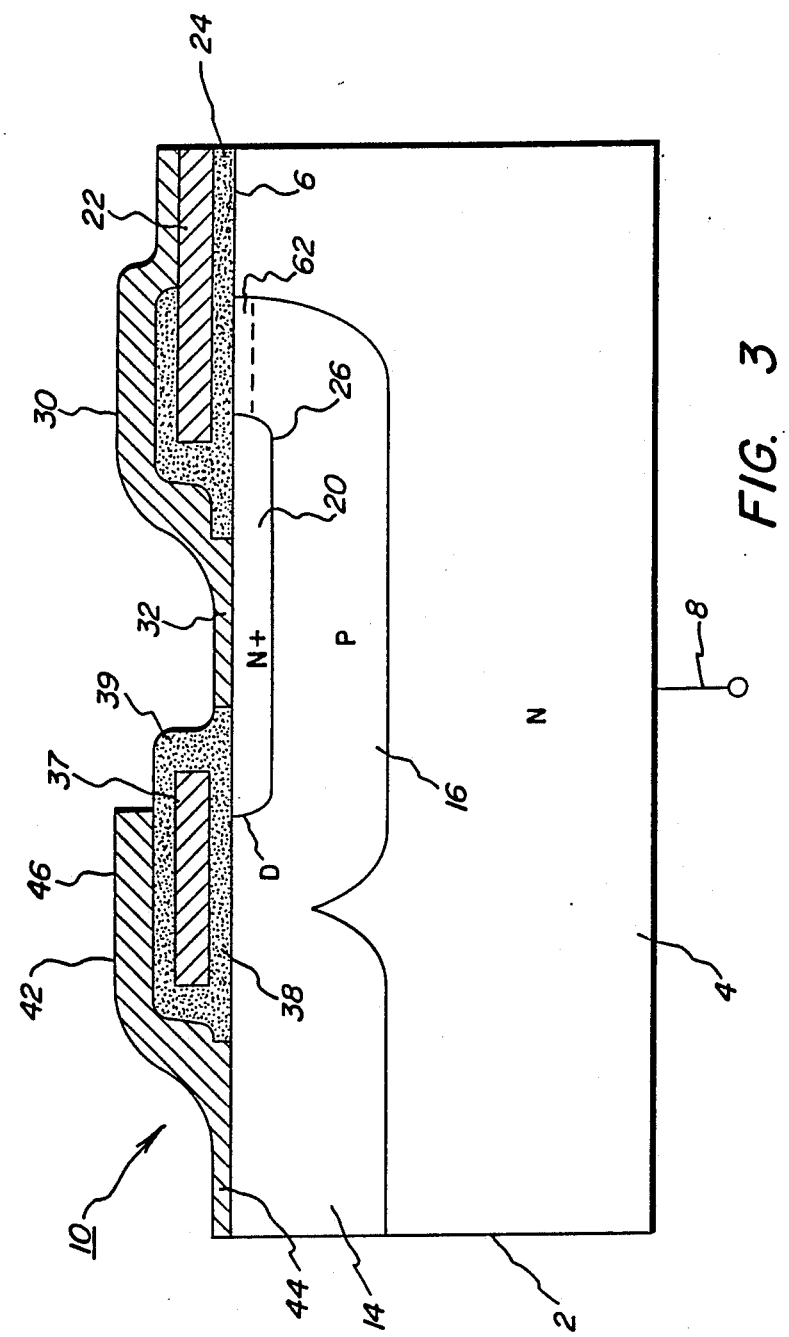

4,890,143

PROTECTIVE CLAMP FOR MOS GATED DEVICES

The present invention relates to metal oxide semiconductor (MOS) gated power devices, and, more particularly, to a protective clamp for a MOS gated device, integrally formed with the device, to protect the device against voltage surges.

BACKGROUND OF THE INVENTION

The layer of oxide that insulates the gate from the other semiconductor regions of a MOS gated device is highly susceptible to damage when a large voltage is applied between the gate and source electrodes of the device. A damaged gate oxide layer between the device's gate and source region can lead to a short circuit between the gate and source region which will render the device non-operational. For typical MOS gated power devices, such as MOSFETS (metal-oxide-semiconductor field effect transistor), IGTS (insulated gate transistor), MCTS (MOS controlled thyristor), etc., this oxide layer thickness is on the order of 1000 angstroms and will usually break down at a voltage of about 80 volts. The oxide layer that insulates the gate from the source region may also have defects therein along its expanse, such as reduced thickness or small openings between the gate and source region. The oxide layer at the location of a defect can break down at voltages on the order of 40–50 volts to create a short circuit between the device's gate and source region. The probability that a defect may be present increases as the device size increases and as the oxide thickness decreases. Furthermore, it is desirable that the oxide layer be as thin as possible to enhance the transconductance of the device. While a thin oxide layer reduces losses and increases efficiency by lowering the on-resistance of the device, it also increases the vulnerability of the oxide layer to damage caused by voltage surges.

It is accordingly an object of the present invention to provide a self-protected MOS gated device which is not subject to the foregoing disadvantages. This method of self protection will differ from that typically employed by signal level MOS gated devices due to the higher gate voltage drive requirements of a power MOS gated device. This makes it impractical to use a standard N+P junction having a breakdown voltage less than 10 volts.

It is another object of the present invention to provide a new and improved protective clamp for a MOS gated device, formed integrally with the device without additional process steps, to protect the device against voltage surges.

A further object of the present invention is to provide a new and improved, self-protected MOS gated power device which is simple in construction and inexpensive to manufacture.

Still another object of the present invention is to provide a protective clamp for a MOS gated device that is integrated with the device, is readily responsive to voltage surges, and is reliable over a long service life.

SUMMARY OF THE INVENTION

Briefly, in accordance with the invention, a MOS gated device is self-protected from voltage surges by means integrally formed in and upon a semiconductor substrate with a DMOS (diffused metal oxide semiconductor) cell of the device. The semiconductor substrate includes a drift region of a first conductivity type terminating in a principal substrate surface, and the DMOS cell includes a base region of a second conductivity type, opposite to the first conductivity type, diffused into the drift region below the principal substrate surface, and a source electrode in electrical contact with the base region at the principal surface. The protective means includes: a well (or base) region of a second conductivity type diffused into the drift region below the substrate surface; a first source region of the first conductivity type diffused into the well region below the substrate surface; a first gate disposed proximate to the substrate surface and spaced therefrom by a first layer of insulation; and a gate contact in electrical contact with both the first source region at the substrate surface and with the first gate for applying a gate drive voltage to the first gate. The first source and well regions form a diode junction which is electrically connected between the source electrode and the gate contact to effectively protect the DMOS cell against voltage surges appearing between the source and gate. The diode junction has conductivity characteristics selected to provide junction breakdown at a predetermined voltage between upper and lower levels of the gate drive voltage corresponding respectively to the breakdown voltage of the insulation layer of the gate and to the maximum gate drive voltage expected to be applied to the gate electrode to render the device operational.

These and other features and advantages and objects of the present invention will become apparent from the following detailed description of the preferred embodiments when read with the accompanying drawings in which applicable reference numerals have been carried forward.

BRIEF DESCRIPTION OF THE DRAWINGS

FIG. 3 is a cross-sectional view of a further embodiment of the protective clamp with a MOS gated device in accordance with the present invention.

DETAILED DESCRIPTION OF THE PREFERRED EMBODIMENTS

Figure 1:
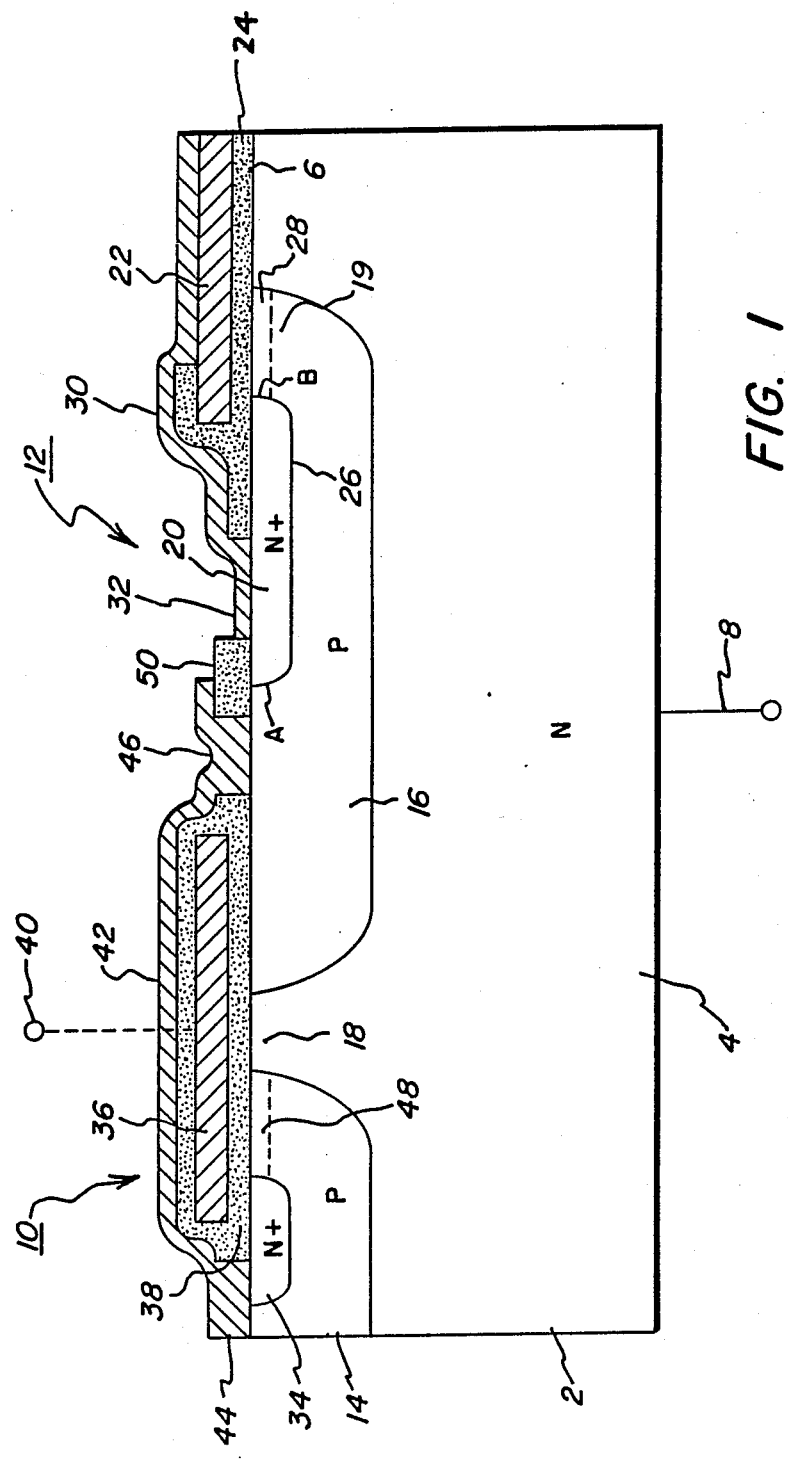
FIG. 1 is a cross-sectional view of one embodiment of a protective clamp with a MOS gated device in accordance with the present invention.

Referring now to FIG. 1, one embodiment of a device of the present invention comprises a semiconductor substrate 2, such as silicon, which includes a drift region 4 of a first conductivity type (e.g. N type) that terminates in a principal substrate surface 6. A terminal 8 or the like is provided for making an electrical connection to the drift region 4. A DMOS cell, indicated generally at 10, is formed in one portion of the substrate. The DMOS cell 10 includes a base region 14 of a second conductivity type (e.g. P type) which is diffused into the N type drift region 4 of the semiconductor substrate 2 along substrate surface 6.

In accordance with the present invention, a voltage clamp structure 12, constituting means for protecting the DMOS cell from surge voltages, is formed in another portion of substrate 2. Clamp structure 12 includes a well region 16 of a second conductivity type (e.g. P type) which is diffused into N type drift region 4 at a spacing from base region 14 along substrate surface 6 to provide an intermediate portion 18 of drift region 4 therebetween, and also includes a first source region 20 of the first type conductivity (e.g. N type), which is diffused into P type well region 16 below substrate surface 6. First source region 20 is relatively heavily doped, and hence may be designated N+. A PN junction or diode 26 is thus formed between the P well region 16 and the N+first source region 20. The N+type conductivity material of first source region 20 exhibits greater conductivity than the N type material of drift region 4. A first polysilicon gate 22 is disposed proximate to surface 6 and spaced therefrom by an insulating layer of silicon oxide 24.

First gate 22 partially overlies first source region 20, drift region 4 and well region 16 at a portion 19 positioned therebetween. A channel 28, shown bounded by a dashed line and by substrate surface 6 is created across well region portion 19 when a gate drive voltage is applied to first gate 22. Channel 28 permits electrical current to flow between drift region 4 and first source region 20 when the MOS gated device is operating under normal conditions. A gate contact 30 is provided for applying the aforesaid gate drive voltage to first gate 22. One end 32 of gate contact 30 is in contact with first source region 20 at substrate surface 6.

A second source region 34 of the first type conductivity (e.g. N type) is diffused into P type base region 14 below substrate surface 6. Second source region 34 is relatively heavily doped, and hence may be designated N+. A second polysilicon gate 36 is disposed proximate to substrate surface 6 and spaced therefrom by an insulating layer of silicon oxide 38. An electrical connection 40 (shown in phantom) is provided for applying a gate drive voltage to second gate 36. A source electrode 42 is disposed over the second gate 36 and insulatively spaced therefrom by some of the material of oxide layer 38. One end 44 of source electrode 42 makes electrical contact with second source region 34, as well as base region 14. An opposite end 46 of source electrode 42 makes electrical contact with well region 16. Thus, the clamp structure junction 26, which is formed at the interface of P well region 16 and N+first source region 20, is connected in series between source electrode 42 and gate contact 30, which are spaced from each other along substrate surface 6 by a length of silicon oxide 50.

As shown, second gate 36 overlies a portion of each of second source region 34, the base region 14, and well region 16, and also overlies the intermediate drift region portion 18. A channel 48, shown bounded by a dashed line and by substrate surface 6, is created across the base region 14 in response to application of a gate drive voltage to second gate 36. Channel 48 permits electrical current to flow between drift region 4 and second source region 34 when the MOS gated device is operating under normal conditions.

In order for clamp structure 12 to protect the insulation layers 24 and 38 from damage due to breakdown of the insulation that may result when a voltage surge occurs between source electrode 42 and gate contact 30, the well region 16 and first source region 20 are preferably doped to concentrations selected to provide junction breakdown at a predetermined voltage at junction 26. The breakdown voltage is selected to fall within a predetermined range between a lower level, corresponding to the maximum gate drive voltage expected to be applied to gates 22 and 36 to render the device operational, and an upper level, corresponding to the voltage at which oxide insulation layers 24 and 38 are subject to damage. Thus, when the device is operational, the voltage between gate contact 30 and source electrode 42 remains within the aforesaid range. Within that range, when the voltage reaches the predetermined breakdown voltage of junction 26, it is clamped at the breakdown value. This clamping action protects oxide layers 24 and 38 beneath gates 22 and 36, respectively, from damage and thereby prevents a short circuit from occurring between gates 22 and 36 and source regions 20 and 34, respectively, of the device.

The breakdown voltage of junction 26 is inversely related to the doping concentrations of well region 16 and first source region 20. During fabrication, well region 16 is preferably formed during the base region diffusion, i.e. well region 16 and base region 14 are both diffused into drift region 4 simultaneously so that no additional steps are required to fabricate DMOS cell 10 with clamp structure 12 over just DMOS cell 10 alone.

Figure 4A:
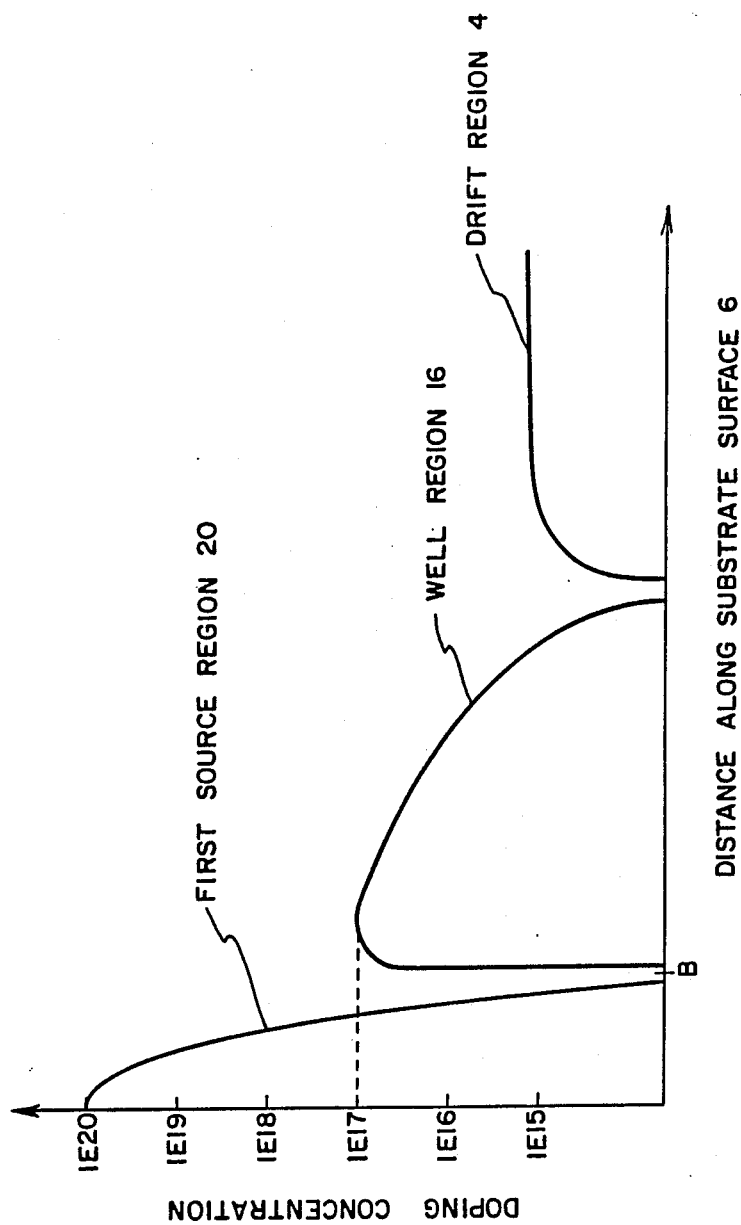
FIG. 4A is a graph of a typical substrate surface doping concentration profile for one region of the device of FIG. 1.
Figure 4B:
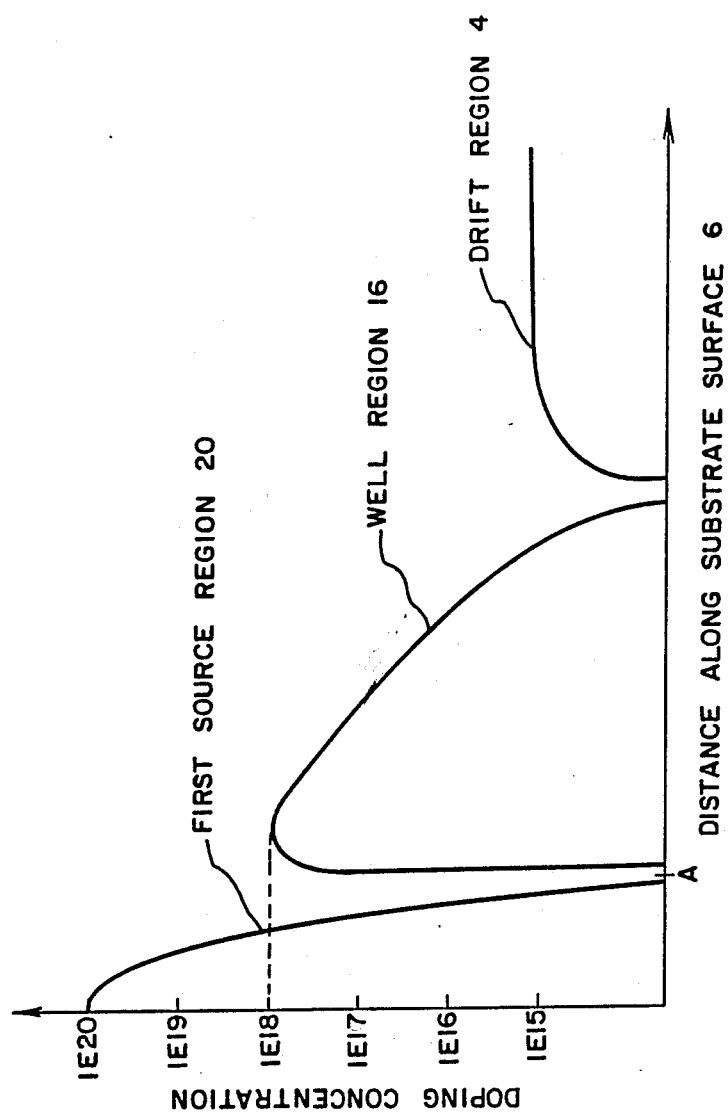
FIG. 4B is a graph of a typical substrate surface doping concentration profile for another region of the device of FIG. 1.

A typical surface doping concentration profile for the device of FIG. 1 is shown in FIGS. 4A and 4B. FIG. 4A shows the doping concentration profile along substrate surface 6 going from a central location of first source region 20 to the right and FIG. 4B shows the concentration profile going from a central location of first source region 20 to the left. Because of the nature of the diffusion process, the doping concentration of first source region 20, well region 16, and drift region 4 along the substrate surface can be characterized by an elliptical or Gaussian function. The surface doping concentration for a P type base region of a MOS gated device can be on the order of 1E18 impurity atoms/cm$^3$. Thus, if well region 16 and base region 14 are both diffused simultaneously, the surface doping concentration of well region 16 at location A can also be on the order of 1E18 impurity atoms/cm$^3$, as shown in FIG. 4B, which results in a junction breakdown voltage at location A of less than 10 volts. This junction breakdown voltage is acceptable for devices in applications where the maximum expected gate drive voltage will be below 10 volts, but some MOS gated devices such as those useful in power applications may have gate drive voltages on the order of 15 volts. A junction breakdown voltage on the order of 10 volts will prevent a device of this latter type from reaching its intended operating condition.

Referring to FIG. 4A (in conjunction with FIG. 1), the surface doping concentrations of first source region 20 and well region 16 decrease from left to right along substrate surface 6. The surface doping concentration near a central location of first source region 20 is about 1E20 impurity atoms/cm$^3$ and is compensated at junction 26 near point B where junction 26 comes to the substrate surface by the doping concentration of opposite conductivity type in the base region. The surface doping concentration of region 16 at location B is typically of the order of 1E17 impurity atoms/cm$^3$. With this lower concentration of impurity atoms at the substrate surface, the breakdown voltage at location B is of the order of 20 to 30 volts, which is sufficiently above the maximum expected gate drive voltage of 15 volts that is applied to a MOS device in some applications. Thus, in applications where a gate drive voltage of relatively large magnitude may be expected or preferred, it is desirable to configure junction 26 to break down at a location where the well region surface concentration is low. This embodiment as shown will not provide adequate protection due to low breakdown voltage at location A. A modified version which would provide adequate protection would require separate masking and implantation steps for well 16 resulting in a lower surface impurity concentration.

Figure 2:
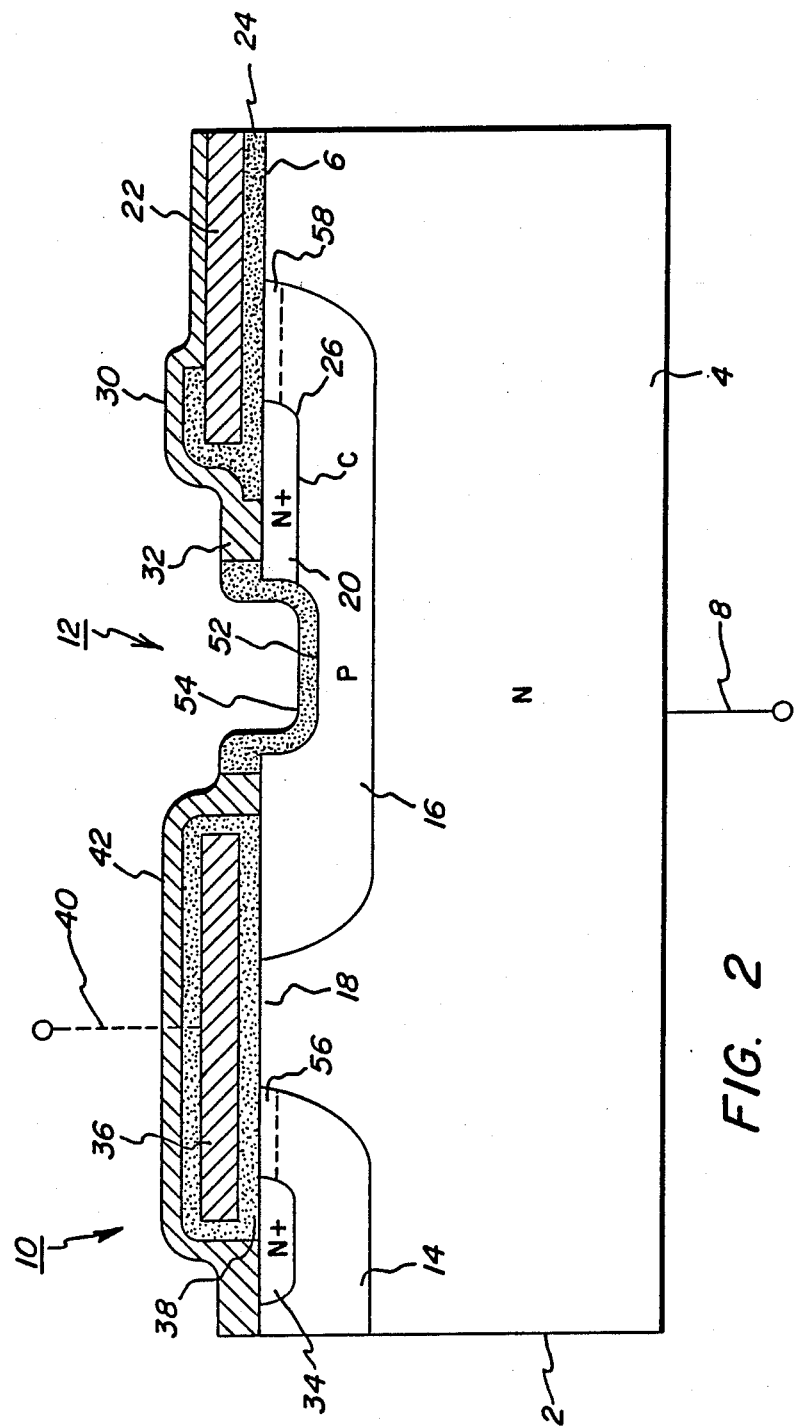
FIG. 2 is a cross-sectional view of an alternate embodiment of the aforesaid protective clamp with a MOS gated device in accordance with the present invention.

FIG. 2 illustrates an embodiment in which breakdown of junction 26 is made to occur at a voltage level sufficiently above the maximum expected gate drive voltage to make the device useful for most typical power applications. The location selected for junction breakdown is generally indicated by the letter C and is situated below end 32 of gate contact 30. End 32 makes electrical contact with the first source region 20 and is spaced from the area where source electrode 42 makes electrical contact with well region 16. In this embodiment, an additional mask step is used in the chip fabrication process whereby contiguous portions of well region 16 and first source region 20 are etched away between source electrode 42 and gate contact 30 to form a cavity 52 in substrate surface 6. Because well region 16 has the same varying surface doping concentration as the embodiment of FIG. 1, the etching removes the area of high doping concentration of well region 16 and with it the area of junction 26 where the breakdown voltage is low. By properly selecting the location and size of cavity 52, the breakdown voltage of junction 26 is increased sufficiently above the maximum expected gate drive voltage to permit proper operation of the device; yet, the junction breakdown voltage is also below the breakdown voltage of gate insulation layers 24 and 38 beneath gates 22 and 36, respectively. The cavity 52 is preferably covered by a silicon oxide layer 54 or other dielectric material to passivate the etched area st substrate surface 6.

In operation, channels 56 and 58, each shown bounded by a dashed line and by substrate surface 6, are respectively created across base region 14 and well region 16 in response to application of a gate drive voltage to second gate 36 and to first gate 22, respectively. Channel 56 permits electrical current to flow between drift region 4 and second source region 34, and channel 58 permits electrical current to flow between drift region 4 and first source region 20 when the MOS gated device is normally operating. To protect gate insulation layers 24 and 38 from damage during a voltage surge across gate contact 30 and source electrode 42, junction 26 will break down in the vicinity of location C to clamp this surge of voltage to the predetermined junction breakdown voltage level. This embodiment, while providing adequate protection, does require additional process steps (mask and etch) relative to the conventional DMOS process.

In another alternate embodiment of the present invention, shown in FIG. 3, which represents the preferred approach since no additional processing steps are required relative to the conventional DMOS process, the junction breakdown voltage level and the breakdown location are determined by laterally diffusing well region 16 underneath a blocking mass 37 of polysilicon material which is disposed proximate to surface 6 and spaced therefrom by an insulating layer of oxide 39. Blocking mass 37 has a narrow width which permits well region 16 and base region 14 to partially, laterally diffuse into each other at their mutual boundary during the DMOS fabrication process. Base region 14 and well region 16 thus form a continuous region of P type conductivity. The surface concentration of well region 16 will be low in the vicinity of location D because of the lateral diffusion of well region 16 underneath blocking mass 37, and the surface concentration will decrease from location D along substrate surface 6 from left to right according to an elliptical or Gaussian function as previously described. Thus, the surface concentration of P well region 16 will be sufficiently low where N+ first source region 20 is diffused into it to form diode junction 26, and the breakdown voltage of junction 26 will therefore be sufficiently above the maximum expected gate drive voltage to permit the device to reach its normal operational state.

As shown in FIG. 3, end 44 of source electrode 42 is disposed on substrate surface 6 and is in electrical contact with base region 14. Opposite end 46 of electrode 42 partially overlies blocking mass 37 and is insulatively spaced therefrom by oxide layer 39, and end 32 of gate contact 30 is in electrical contact with first source region 20 at substrate surface 6. Since base region 14 and well region 16 form a continuous region and first source region 20 is diffused into well region 16 to form junction 26, junction 26 is therefore in series between source electrode 42 and gate contact 30.

In the embodiment of FIG. 3, the second source region, shown at 34 in FIGS. 1 and 2, is eliminated from the portion of substrate 4 containing DMOS cell 10 since first source region 20 can perform the function of second source region 34 under normal operating conditions.

In operation, a channel 62, shown bounded by a dashed line and by substrate surface 6 in FIG. 3, is created across well region 16 in response to application of a gate drive voltage to first gate 22. Channel 62 permits electrical current to flow between drift region 4 and first source region 20 when the MOS gated device is normally operating. During a voltage surge across gate contact 30 and source electrode 42 of magnitude exceeding the breakdown voltage of junction 26, junction 26 will break down to clamp this surge of voltage at the predetermined junction breakdown voltage level to protect insulation layers 24 and 38 from damage.

Figure 5:
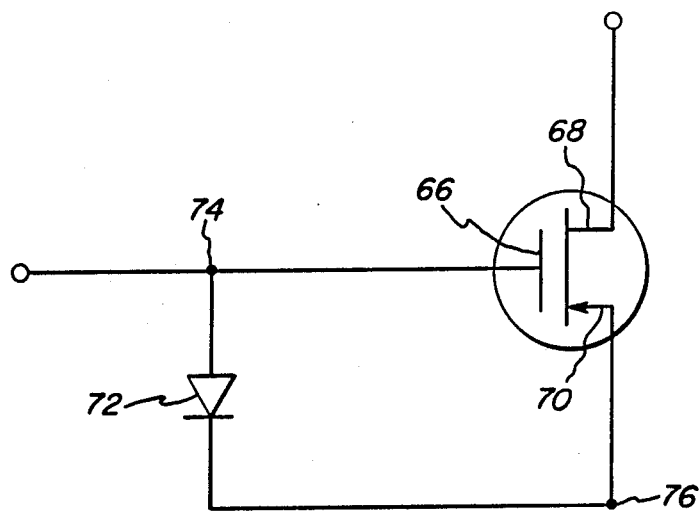
FIG. 5 is a schematic diagram of the equivalent circuit of the present invention.

An equivalent circuit of a self-protected MOS gated device, in accordance with the present invention, is schematically shown in FIG. 5. The device includes a MOS gated device 64, shown as a field effect transistor, having a gate 66, a drain 68, and a source 70. A diode 72 is electrically connected between gate terminal 74 and source terminal 76. Diode 72 is selected to have a breakdown voltage that is less than the breakdown voltage of the oxide insulation layer between gate 74 and source 70 to protect the gate insulation layer from damage caused by voltage surges. Diode 72 is further selected to have a breakdown voltage which is more than the maximum expected gate drive voltage to permit normal operation of the device.

It will be readily understood by those skilled in the art that the present invention is not limited to the specific embodiments described and illustrated herein. Different embodiments and adaptations besides those herein described, as well as many variations, modifications and equivalent arrangements will now be apparent from, or be reasonably suggested by, the foregoing specification and drawings without departing from the substance or scope of the invention.

Accordingly, it is intended that the invention be limited only by the spirit and scope of the claims appended hereto.

What is claimed as new and desired to be secured by Letters Patent is:

1. A self-protected MOS gated device, comprising:
    a semiconductor substrate;
    a drift region of a first conductivity type extending into said substrate from a principal substrate surface;
    a base region extending into said drift region from said substrate surface and being of a second conductivity type opposite to the first conductivity type;
    a source electrode in electrical contact with said base region at said principal surface;
    a first gate disposed proximate to said principal surface and spaced therefrom by a first layer of insulation;
    a gate contact abutting said principal surface and spaced from said source electrode for applying a gate drive voltage to said first gate; and
    means for protecting said MOS gated device from surge voltages, including:
        a well region extending into said drift region from said substrate surface and being doped to a first predetermined level of said second conductivity type; and
        a first source region extending into said well region and being in electrical connection with, and abutting, said gate contact, said first source region being doped to a second predetermined level of said first conductivity type and forming a junction with said well region, said first and second predetermined levels of doping being selected to provide said junction with a breakdown voltage greater than a maximum expected value of gate drive voltage and less than the breakdown voltage of said first insulation layer;
        said first gate partially overlying said first source and drift regions and overlying at least a portion of said well region positioned therebetween.

2. The device of claim 1 wherein said well region and said base region are laterally merged with each other.

3. The device of claim 1 wherein said respective well region and first source region comprise respective P and N type conductivity materials to form said junction as a diode junction.

4. The device of claim 3 wherein said diode junction has a varying doping concentration along its length selected to provide junction breakdown at a selected location when the gate drive voltage exceeds said maximum expected value.

5. The device of claim 1 wherein
    said well region and said base region are mutually spaced from each other at said principal surface by an intermediate portion of said drift region;
    said source electrode is in electrical contact with said well region at said principal surface; and
    said device further includes:
        a second source region extending into said base region and being of said first conductivity type, said second source region being in electrical contact with said source electrode;
        a second gate disposed proximate to said principal surface and spaced therefrom by a second layer of insulation, said second gate overlying part of each of said second source region, said base region, said intermediate portion of said drift region and said well region; and
    means for electrically connecting to said second gate.

6. The device of claim-5 wherein said respective well region and first source region comprise respective P and N type conductivity materials to form said junction as a diode junction, said diode junction having a junction breakdown voltage selected to be less than the breakdown voltage of each of said layers of insulation and greater than said maximum expected value of gate drive voltage to be applied to said gate to render said device operational.

7. The device of claim 6 wherein said diode junction has a varying doping concentration along its length selected to provide junction breakdown at a selected location when the gate drive voltage exceeds said maximum expected value.

8. The device of claim 7 including a cavity formed in said well region adjacent said first source region and extending into said substrate from said principal surface thereof so as to limit the maximum doping concentration of said well region adjacent said first source region to a value ensuring that said junction between said well region and said first source region will break down at said selected location when the gate drive voltage exceeds said maximum expected value.

9. A self-protected MOS gated device, comprising:
    a semiconductor substrate;
    a drift region of a first conductivity type situated in said substrate below a principal substrate surface;
    means for electrically connecting to said drift region;
    a DMOS cell formed in said substrate including:
        a base region of a second conductivity type opposite to said first conductivity type and diffused into said drift region from said principal surface;
        a source electrode in electrical contact with said base region at said principal surface; and
        voltage clamping means formed in said substrate for protecting said DMOS cell from voltage surges, said clamping means including:
            a well region of said second conductivity type diffused into said drift region below said principal surface;
            a first source region of said first conductivity type diffused into said well region below said principal surface to form a diode junction therewith;
            a first gate disposed proximate to said principal surface and spaced therefrom by a first layer of insulation, said first gate partially overlying said first source and drift regions at said principal surface and overlying at least a portion of said well region positioned therebetween; and
            a gate contact abutting said first source region at said principal surface and being in electrical contact with said first gate for applying a gate drive voltage to said first gate;
            said junction being disposed in an electrical path between said source electrode and said gate contact, said well region and said first source region being doped to predetermined levels selected to provide said junction with a breakdown voltage greater than a maximum expected value of gate drive voltage and less than the breakdown voltage of said first insulation layer to effectively protect said first insulation layer from voltage surges occuring between said source electrode and said gate contact.

10. The device of claim 9 wherein said well region and said base region are laterally merged with each other.

11. The device of claim 9 wherein said respective well region and first source region comprise respective P and N type conductivity materials to form said diode junction.

12. The device of claim 11 wherein said diode junction has a varying doping concentration along its length selected to provide junction breakdown at a predetermined location when the gate drive voltage exceeds said maximum expected value.

13. The device of claim 9 wherein
said well region and said base region are mutually spaced from each other at said principal surface by an intermediate portion of said drift region;
said source electrode is in electrical contact with said well region at said principal surface; and
said DMOS cell further includes
a second source region of said first conductivity type diffused into said base region below said principal surface and being in electrical contact with said source electrode;
a second gate disposed proximate to said principal surface and spaced therefrom by a second layer of insulation, said second gate overlying part of each of said second source region, said base region, said intermediate portion of said drift region and said well region; and
means for electrically connecting to said second gate.

14. The device of claim 13 wherein said respective well region and first source region comprise respective P and N type conductivity materials to form said diode junction, said diode junction having a junction breakdown voltage selected to be less than the breakdown voltage of each of said insulation layers and greater than said maximum expected value of gate drive voltage to be applied to said gate to render said DMOS cell operational.

15. The device of claim 14 wherein said diode junction has a varying doping concentration along its length selected to provide junction breakdown at a predetermined location when the gate drive voltage exceeds said maximum expected value.

16. The device of claim 15 including a cavity formed in said well region adjacent said first source region and extending into said substrate from said principal surface thereof so as to limit the maximum doping concentration of said well region adjacent said first source region to a value ensuring that said junction between said well region and said first source region will break down at said predetermined location when the gate drive voltage exceeds said maximum expected value.

* * * * *